United States Patent [19]

Nobel et al.

[11] Patent Number: 4,701,244

[45] Date of Patent: * Oct. 20, 1987

[54] BATH AND PROCESS FOR ELECTROPLATING TIN, LEAD AND TIN/ALLOYS

[75] Inventors: Fred I. Nobel, Sands Point; Barnet D. Ostrow, Roslyn, both of N.Y.

[73] Assignee: LeaRonal, Inc., Freeport, N.Y.

[*] Notice: The portion of the term of this patent subsequent to Jan. 21, 2003 has been disclaimed.

[21] Appl. No.: 738,615

[22] Filed: May 28, 1985

Related U.S. Application Data

[63] Continuation-in-part of Ser. No. 564,516, Dec. 22, 1983, Pat. No. 4,599,149, which is a continuation-in-part of Ser. No. 301,390, Sep. 11, 1981, abandoned.

[51] Int. Cl.$^4$ .................. C25D 3/32; C25D 3/36; C25D 3/56; C25D 3/60

[52] U.S. Cl. .................. 204/44.4; 204/53; 204/54.1

[58] Field of Search .............. 204/44.4, 53, 54 R, 204/114, 120, 123

[56] References Cited

U.S. PATENT DOCUMENTS

| | | | |
|---|---|---|---|
| 2,525,942 | 10/1950 | Proell | 204/45 |
| 3,082,157 | 3/1963 | Francisco et al. | 204/54.1 |
| 3,663,384 | 5/1972 | Lescure | 204/44.4 |
| 3,730,853 | 5/1973 | Sedlacek et al. | 204/43 S |
| 3,749,649 | 7/1973 | Valazil | 204/43 S |
| 3,769,182 | 10/1973 | Beckwith et al. | 204/43 S |
| 3,785,939 | 1/1974 | Hsu | 204/43 S |
| 3,905,878 | 9/1975 | Dohi et al. | 204/45 |
| 4,000,047 | 12/1976 | Ostrow et al. | 204/43 S |
| 4,072,582 | 2/1978 | Rosenberg | 204/54 R |
| 4,118,289 | 10/1978 | Hsu | 204/43 S |
| 4,132,610 | 1/1979 | Dohi et al. | 204/44.4 |
| 4,135,991 | 1/1979 | Canaris et al. | 204/43 S |
| 4,384,930 | 5/1983 | Eckles | 204/43 |
| 4,388,158 | 6/1983 | Inui et al. | 204/27 |
| 4,459,185 | 7/1984 | Obata et al. | 204/43 S |
| 4,565,609 | 1/1986 | Nobel et al. | 204/44.4 |
| 4,565,610 | 1/1986 | Nobel et al. | 204/44.4 |
| 4,599,149 | 7/1986 | Nobel et al. | 204/44.4 |
| 4,617,097 | 10/1986 | Nobel et al. | 204/44.4 |

FOREIGN PATENT DOCUMENTS

| | | | |
|---|---|---|---|
| 122265 | 9/1976 | German Democratic Rep. | 204/44.4 |
| 555929 | 9/1943 | United Kingdom . | |

OTHER PUBLICATIONS

Dohi et al., "Bright Solder and Indium Plating from Methane Sulfonic Acid", Proceeding of Electroplating Seminar, 7/78.

Dohi et al., "Electrodeposition of Bright Tin-Lead Alloys from Alkanolsulfonate Baths", Proceedings of Interfinish 80.

*Primary Examiner*—G. L. Kaplan
*Attorney, Agent, or Firm*—Pennie & Edmonds

[57] ABSTRACT

The invention relates to the electrolytic plating of tin and lead metals and particularly to tin-lead alloys by dissolving divalent tin or lead compounds in an excess of a lower alkyl sulfonic acid or acid salt. The electrolytic bath comprises such additives as benzal acetone, benzaldehyde or derivatives thereof, aromatic pyridines; surfactants such as betaines, alkylene oxides polymers, imidazolinium compounds and quaternary ammonium salts and formaldehyde.

36 Claims, No Drawings

BATH AND PROCESS FOR ELECTROPLATING TIN, LEAD AND TIN/ALLOYS

CROSS REFERENCE TO RELATED APPLICATIONS

The application is a continuation-in-part of Ser. No. 564,516, filed Dec. 22, 1983, now U.S. Pat. No. 4,599,149 which is a continuation-in-part of Ser. No. 301,390, filed Sept. 11, 1981, abandoned.

TECHNICAL FIELD

The invention relates to the electrolytic plating of tin and lead metals and particularly to tin-lead alloys by dissolving divalent tin or lead compounds in an excess of a lower alkyl sulfonic acid.

BACKGROUND OF THE INVENTION

The time-honored method for plating tin-lead alloys, commonly called Solder Plate, is to have these two metals present in solution as fluoborates with an excess of fluoboric acid and boric acid. In order to obtain smoother deposits, it is common to add various types of proteins, such as peptones, glue, gelatin or meat proteins. The fluoborate based bath containing peptone is most commonly used and it is commercialy successful in obtaining smooth matte deposits. Brighter tin-lead solder deposits can be obtained from these fluoborate based baths by adding various brightening agents, such as aromatic alkane pyridine compounds, ethylene oxide wetting agents and formaldehyde.

The main problem with these fluoborate based baths is the fluoborate ion itself. Fluoborates are not only highly poisonous but are also highly corrosive to the equipment used in the plating environment. Fluoborates are also difficult to remove from the waste water that follows the plating operation and presents a serious problem for the waste-disposal engineer.

U.S. Pat. No. 2,525,942 to Proell, patented Oct. 17, 1950 broadly discloses the use of concentrated solutions of various metals including lead in alkane sulfonic acids containing 1 to 5 carbon atoms in the alkyl group. The invention requires at least 10 percent by weight of the metal alkanesulfonate. The most advantageous pH of the electrolytic solution varies with the metal used and the pH designated for the lead electrolyte is between 4 and 5.

The article entitled "Electrodeposition Of Bright Tin-Lead Alloys From Alkanolsulfonate Bath," by N. Dohi and K. Obata, Proceedings of Interfinish 80, discloses the electrodeposition of tin-lead alloys using alkanolsulfonate baths. The alkanolsulfonates found to be suitable for the electrodeposition of tin-lead alloys were those having a short carbon chain and in which the hydroxyl group is on a carbon atom near the sulfonic acid group.

SUMMARY OF THE INVENTION

This invention relates to the electrodeposition of tin, lead and particularly tin-lead alloys from an electroplating bath comprising a lead and/or tin alkylsufonate containing less than about 8% by weight of the metal alkanosulfonates and an excess of free alkylsulfonic acid sufficient to bring the pH of the bath below about 3 and advantageously to less than about 2.

The alkanolsulfonates in the Dohi article referred to above have been found to be deficient in many respects and not presently commercially feasible, since they are relatively expensive and difficult to prepare.

The baths of the Proell patent are disclosed as being particularly suitable for electroplating lead and nickel. Neither tin nor tin-lead alloys are specifically referred to in the patent. The disclosure in the Proell patent requires at least 10 percent by weight of the metal alkyl sulfonate in the solution and a pH of no less than at least 4. The Proell patent also discloses, in column 4, that as the acidity drops below about 5, cathode efficiency drops rapidly. Applicants have found, however that the electroplating baths of this invention have good cathode efficiency even at pH's between 1 and 2. The applicants have also found that by limiting the metal alkylsulfonate salt content below about 8 percent by weight and using a large excess of acid or acid salt, the throwing power is considerably improved rendering applicants' electroplating baths very advantageous in rack plating where low current densities are used and high throwing power desired.

THE INVENTION IN DETAIL

The tin and lead compounds useable are those which are soluble in the alkyl sulfonic acid and which will form an alkyl sulfonic acid salt. The alkyl sulfonic acids and their tin and lead salts are known compounds and can be readily prepared by those skilled in the art and as disclosed in U.S. Pat. No. 2,525,942 as well as by the art cited therein.

The alkyl sulfonic acids useful according to the invention are those which are water soluble. The lower alkyl sulfonic acids containing 1–5 carbon atoms are thus most advantageous, particularly methane or methyl sulfonic acid.

The amount of the total metal salt when using methyl sulfonic acid is less than about 8 percent by weight. Increased amounts of the metal salts significantly decrease the throwing power of the solution particularly at low current densities. The most advantageous amounts are from about 4.5 to 2 percent of the metal salt of about 3 to 1 percent of the metal or metals as the sulfonic acid salt.

The invention includes improved tin and/or lead alkyl sulfonic acid baths of improved throwing power and improved surface finish containing quaternary nitrogen-fatty acid based wetting agents.

The preferred quaternary nitrogen-fatty acid based wetting agents are the water or solution soluble imidazolines, monoazolines and amidobetaines. These types of wetting agents are well known in the art and are commercially available from Lonza Inc. under the tradename AMPHOTERGE, from Miranol Chemical Company, Inc. under the tradenames MIRANOL and MIRATAINE, and from Mona Industries Inc. under the tradename MONATERICS. Other manufacturers for these materials are also available.

AMPHOTERGE compounds are alkyl dicarboxy imidazoline surfactants, which can generally be categorized as an alkyl imidazolines. Also, as noted below, salts of these compounds may also be used. The only limitation on the use of these compounds is that they must be water or bath soluble.

The MONATERICS wetting agents include ampholytic amino-betaine and imidazoline derivatives. This would include monazoline compounds such as 1-(hydroxyethyl)-2-alkyl imidazolines.

The most preferred compounds are the imidazolines having the formula:

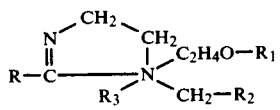

in which R is a fatty acid radical; $R_1$ is H, Na or $CH_2COOM$: $R_2$ is COOM, $CH_2$—COOM or $CHOHCH_2SO_3M$; M is Na, H or an organic base; and $R_3$ is OH, an acid salt or the salt of an anionic surface active sulfate or sulfonate.

The most advantageous compounds are those in which R contains 6 carbon atoms or more, $R_1$ is $CH_2COOM$, $R_2$ is COOM and $R_3$ is OH. Best results to date have been obtained from the compound where R is $C_7H_{15}$ (capric), $R_1$ is $CH_2COONa$, $R_2$ is COONa and $R_3$ is OH. (AMPHOTERGE KJ-2).

Carboxylic or sulfonic acid-fatty acid wetting agents containing tertiary nitrogen such as the compound of formula (5) can also be used and the quarternary formed in situ by the acid contained in the bath. This same compound where R is $C_{12}H_{20}$ (coconut oil), also gives excellent results. Oleic hydroxyethyl alkyl imidazole and N' cocoyl-N-N' dimethyl glycine are other specific examples of imidazoline wetting agents.

Other compounds found to be useful according to the invention include:

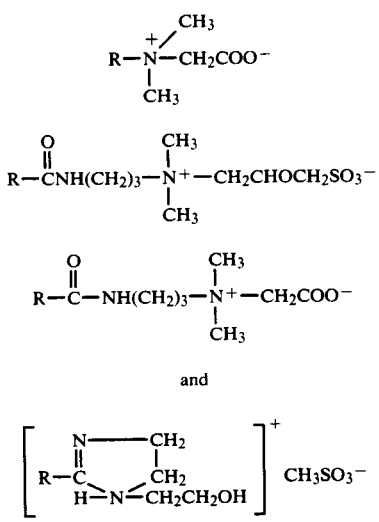

where R has the same meaning as assigned above with respect to formula (1). The chain lengths of the various alkyl radicals and group can also be varied so long as water or solution solubility is maintained and the compounds retain wetting agent properties.

The compounds of formula (3) and (4) are, at present, of secondary interest. They produce improved finishes and throwing power but not as well as the compounds of formulas (1) and (2). Compounds according to formulas (1) and (2) produce solder deposits of a smooth matte finish equal in every way to those obtained form the peptone containing fluoborate based baths that are commonly used in industry today.

Examples of some specific compounds of formulas (3) and (4) include dimethyl [3 cocoamidopropyl] ammonioethanoate and coco amidopropyl dimethyl ammonia-2-hydroxypropane sulfonate.

R has been designated in the above formulas as being a fatty acid radical. The fatty group can be saturated or unsaturated. The only upper limit on the number of carbon atoms would be the solubility of the compound in the bath solution, and this may vary depending on the compound being used. For example, the compound of formula (2) can contain more carbon atoms in the fatty group than that of formula (1) and still retain water solubility. The particular anion in the above formulas is not critical but sodium is preferred. Mixtures of the wetting agents can also be used.

The wetting agents according to this invention are broadly defined as quaternary nitrogen wetting agents containing a fatty group derived from a fatty acid and one or more solubilizing groups. The solubilizing can be a carboxylic or sulfonic acid group, alkanol group, etc.

The amount of the wetting agent is not critical and optimum amounts will vary depending on the particular agent selected for use and the particular bath in which it is used. A sufficient amount of the wetting agent should be used to obtain the results desired. Generally, 1 to 2 ml/l of the wetting agents give excellent results with pure tin and 60/40 tin-lead alloy baths. Higher amounts could be used but there is no particular reason to do so. As the lead content of the bath is increased, additional amounts of the wetting agent may have to be employed. Pure lead baths may require as much as 40 ml/l or more of the wetting agent to obtain improved surface characteristics and improved throwing paper.

The addition of the quaternary nitrogen wetting agents markedly improves the coverage at low current densities (5–20 asf) and the baths are thus particularly advantageous in rack plating, such as circuit boards, where low current densities are employed and high throwing power is required. With the more advantageous wetting agents, coverage can be obtained at current densities at even 1 or 2 asf.

The plating baths of this invention can also be advantageously used to produce bright deposits by the addition of materials that are also commonly used for the fluoborate type baths when bright deposits are desired. These known brighteners are advantageously aromatic aldehydes such as chlorobenzaldehyde, benzaldehyde, said benzal acetone. Other brightening agents which have been used with the fluoborate baths include aromatic pyridine compounds, ethylene oxide wetting agents and formaldehyde. These materials can be used in substantially the same proportions as used in the fluoborate baths.

Suitable ethylene oxide wetting agents which have been used include condensation products of ethylene oxide and alkyl phenols or higher alcohols (as shown in British Patent Specification No. 1,151,460 and U.S. Pat. No. 3,905,878); aliphatic alcohol, sorbitan alkyl ester, or alkyl phenol ethylene oxide condensates (U.S. Pat. No. 3,875,029); alkyl phenoxy poly (ethyleneoxy) ethanols (U.S. Pat. No. 4,242,182); water soluble ethers of polyglycols (U.S. Pat. No. 3,361,652); polyethylene glycol-derived alkylphenol, ether, or alkylamide compounds (U.S. Pat. No. 3,661,730); polyoxy alkylated compounds such as polyethoxylated alkyl phenols or polyethoxylated fatty acid monoalkanolamides and related amines (U.S. Pat. No. 4,118,289); and condensation products or polyalkylene oxides with other compounds (Table III of U.S. Pat. No. 4,000,047).

The plating bath can be prepared by placing tin and/or lead sulfonic acid salt in an excess of the alkyl sulfonic acid, adjusting the acid content to the required pH, removing any undissolved matter by filtration, and then diluted with water to the final desired volume. The plating bath is generally operated at ambient temperatures. Agitation is desirable for increased plating speed.

Various alloys can be produced by varying plating solutions depending on the metal ratios. For plating 60:40 a tin-lead alloy, 20 g/l of tin metal and 10 g/l of lead metal should be used. With such a bath, uncombined methanesulfonic acid is advantageously about 150 g/l of 100 percent methanesulfonic acid.

The addition of a small amount of a reducing agent to the baths will assist in keeping the tin in the soluble divalent state, since quadravalent tin is insoluble in the bath. About 0.5 g/l of resorcinol is generaly sufficient to accomplish this purpose.

It is also advantageous to use a tin-lead alloy anode of the same composition as the alloy being deposited. For example, when plating a 60:40 tin-lead alloy, a 60:40 tin-lead alloy anode should be used. This system lends stability to the bath with respect to the metals throughout its life.

The following examples illustrate the invention; all plating was accomplished with a Hull cell.

EXAMPLE 1

| | |
|---|---|
| Tin metal (as the methyl sulfonate) | 18 g/l |
| Lead metal (as the methyl sulfonate) | 9 g/l |
| Free methyl sulfonic acid | 70 ml/l (100% basis) |
| Ambient temperature | |
| Current density | 5 to 15 asf |

The deposit obtained is a 60/40 tin-lead alloy having a dark grey matte appearance.

EXAMPLE 2

2 ml/l of capric dicarboxy imidazoline, a product of Lonza Inc. marketed under the trademark AMPHOTERGE KJ-2, was added to the plating solution of Example 1. The resulting 60/40 tin/lead alloy deposit is white matte and the low current density coverage is markedly improved.

EXAMPLE 3

| | |
|---|---|
| Tin metal (as the methane sulfonate) | 20 g/l |
| Free methane sulfonic acid | 70 ml/l (100% basis) |
| Ambient temperature | |
| Current density | 5-15 asf |

The resulting deposit is pure tin and has a dark grey matte appearance.

EXAMPLE 4

2 ml/l of AMPHOTERGE KJ-2 and 2 ml/l of a coco betaine according to forumla (2) where R is the coco alkyl radical and marketed by the Mirnol Chemical Co., Inc. under the trademark MIRATAINE CDMB are added to the plating composition of Example 3. The pure tin deposit was a white matte and the low current density coverage is markedly improved.

EXAMPLE 5

| | |
|---|---|
| Tin Metal (as methyl sulfonic acid) | 90 g/l |
| Free methyl sulfonic acid | 150 ml/l (100% basis) |
| Ambient temperature | |
| Current density | 10-25 asf |

The above solution is electroplated onto a suitable substrate, the deposit is pure tin and has a dark grey matte appearance.

EXAMPLE 6

The addition of 4 ml/l of a coconut imidazoline amphoteric surfactant manufactured by Mona Industries, Inc. under the trade name MONATERIC CA to the plating solution of example 5 produced a white matte deposit and the low current density coverage was considerably improved.

EXAMPLE 7

| | |
|---|---|
| Lead metal (as acetate) | 15 g/l |
| Methyl sulfonic acid | 50 ml/l (100% basis) |
| Ambient temperature | |
| Current density | 5-15 asf |

The above solution produces a deposit of pure lead having a dark grey matte appearance.

EXAMPLE 8

40 ml/l of 1-hydroxyethyl-2-oleicimidazoline is added to the plating solution of Example 7. The resulting pure lead deposit has a white matte appearance and the low current density coverage is considerably improved.

EXAMPLE 9

| | |
|---|---|
| Tin metal (as methane sulfonic acid) | 20 g/l |
| Lead metal (as methane sulfonic acid) | 2 g/l |
| Methane sulfonic acid | 70 ml/l (100% basis) |
| Ambient temperature | |
| Current density | 2-30 asf |
| AMPHOTERGE KJ-2 (by Lonza) | 1 ml/l |

Deposits are white matte and analyze 90% tin, 10% lead.

It is also possible to add a conducting salt if needed to improve solution conductivity or throwing power. The alkali salt of the methyl sulfonic acid adjusted to the pH of the bath can be used.

EXAMPLE 10

| | |
|---|---|
| Tin metal (as methyl sulfonic acid) | 15 g/l |
| Lead metal (as methyl sulfonic acid) | 2 g/l |
| Sodium salt of methyl sulfonic acid | 75 g/l |
| pH (adjusted with methyl sulfonic acid or NaOH) | |
| Ambient temperature | |
| AMPHOTERGE KJ-2 (by Lonza) | 1½ ml/l |
| Current density | 10-40 asf |

Deposits are white matte and analyze 80% tin, 20% lead. Other alloys are possible by adjusting the ratios of tin and lead in the plating bath.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

We claim:

1. A tin, lead, or tin-lead alloy electroplating bath, which comprises:

(a) a bath containing an alkanesulfonic acid, and either a divalent tin salt or a divalent lead salt thereof or both;
(b) a surfactant selected from the group consisting of:
  (1) a cationic surfactant selected from the group consisting of quaternary ammonium salts and alkyl imidazolinium salts,
  (2) an amphoteric surfactant selected from the group consisting of betaines, and
  (3) a nonionic surfactant selected from the group consisting of at least one ethylene oxide wetting agent; and
(c) an additive selected from the group consisting of benzal acetone, benzaldehyde and at least one benzaldehyde derivative.

2. The bath of claim 1 further comprising a reducing agent for maintaining the tin in the divalent state.

3. A method for electroplating a tin, lead or tin-lead alloy upon a substrate which comprises immersing a substrate into the electroplating bath of claim 2 and electroplating a tin, lead or tin-lead alloy thereupon.

4. A method for electroplating a tin, lead or tin-lead alloy upon a substrate which comprises immersing a substrate into the electroplating bath of claim 1 and electroplating a tin, lead or tin-lead alloy thereupon.

5. A tin, lead or tin-lead alloy electroplating bath, which comprises:
(a) a bath containing an alkanesulfonic acid and either a divalent tin salt or a divalent lead salt thereof or both;
(b) a nonionic surfactant selected from the group consisting of at least one ethylene oxide wetting agent; and
(c) an additive selected from the group consisting of benzal acetone, benzaldehyde and at least one benzaldehyde derivative.

6. The bath of claim 5 further comprising a reducing agent for maintaining the tin in the divalent state.

7. A method for electroplating a tin, lead or tin-lead alloy upon a substrate which comprises immersing a substrate into the electroplating bath of claim 6 and electroplating a tin, lead or tin-lead alloy thereupon.

8. A method for electroplating a tin, lead or tin-lead alloy upon a substrate which comprises immersing a substrate into the electroplating bath of claim 5 and electroplating a tin, lead or tin-lead alloy thereupon.

9. A tin, lead or tin-lead alloy electroplating bath which comprises:
(a) a bath containing an alkyl sulfonic acid, and either a divalent tin salt or a divalent lead salt or both;
(b) a surfactant selected from the group consisting of
  (1) a cationic surfactant selected from the group consisting of quaternary ammonium salts and imidazolinium salts, and
  (2) an amphoteric surfactant selected from the group consisting of betaines, and
(c) benzal acetone, benzaldehyde or a benzaldehyde derivative.

10. The bath of claim 9 further comprising a reducing agent for maintaining the tin in the divalent state.

11. A method for electroplating a tin, lead or tin-lead alloy upon a substrate which comprises immersing a substrate into the electroplating bath of claim 8 and electroplating a tin, lead or tin-lead alloy thereupon.

12. A method for electroplating a tin, lead or tin-lead alloy upon a substrate which comprises immersing a substrate into the electroplating bath of claim 9 and electroplating a tin, lead or tin-lead alloy thereupon.

13. A tin, lead or tin-lead alloy electroplating bath which comprises:
(a) a bath containing an alkanesulfonic acid and either a divalent tin salt, divalent lead salt thereof or both;
(b) at least one cationic, amphoteric or nonionic surfactant; and
(c) an aromatic aldehyde.

14. The bath of claim 13 wherein the surfactant is an alkyl imidazoline salt, a betaine or a condensation product of an ethylene oxide compound.

15. The bath of claim 14 wherein the aromatic aldehyde is benzal acetone, benzaldehyde or a benzaldehyde derivative.

16. A method for electroplating a tin, lead or tin-lead alloy upon a substrate which comprises immersing a substrate into the electroplating bath of claim 15 and electroplating a tin, lead or tin-lead alloy thereupon.

17. The bath of claim 14 further comprising a reducing agent for maintaining the tin in the divalent state.

18. A method for electroplating a tin, lead or tin-lead alloy upon a substrate which comprises immersing a substrate into the electroplating bath of claim 17 and electroplating a tin, lead or tin-lead alloy thereupon.

19. A method for electroplating a tin, lead or tin-lead alloy upon a substrate which comprises immersing a substrate into the electroplating bath of claim 14 and electroplating a tin, lead or tin-lead alloy thereupon.

20. The bath of claim 13 wherein the surfactant is a condensation product of an ethylene oxide compound.

21. The bath of claim 20 wherein the aromatic aldehyde is benzal acetone, benzaldehyde or a benzaldehyde derivative.

22. A method for electroplating a tin, lead or tin-lead alloy upon substrate which comprises immersing a substrate into the electroplating bath of claim 21 and electroplating a tin, lead or tin-lead alloy thereupon.

23. A method for electroplating a tin, lead or tin-lead alloy upon a substrate which comprises immersing a substrate into the electroplating bath of claim 20 and electroplating a tin, lead or tin-lead alloy thereupon.

24. The bath of claim 13 further comprising a bath soluble bismuth compound.

25. The bath of claim 24 further comprising a reducing agent for maintaining the tin in the divalent state.

26. A method for electroplating a tin, lead or tin-lead alloy upon a substrate which comprises immersing a substrate into the electroplating bath of claim 25 and electroplating a tin, lead or tin-lead alloy thereupon.

27. A method for electroplating a tin, lead or tin-lead alloy upon a substrate which comprises immersing a substrate into the electroplating bath of claim 24 and electroplating a tin, lead or tin-lead alloy thereupon.

28. The bath of claim 13 further comprising a reducing agent for maintaining the tin in the divalent state.

29. A method for electroplating a tin, lead or tin-lead alloy upon a substrate which comprises immersing a substrate into the electroplating bath of claim 28 and electroplating a tin, lead or tin-lead alloy thereupon.

30. A method for electroplating a tin, lead or tin-lead alloy upon a substrate which comprises immersing a substrate into the electroplating bath of claim 13 and electroplating a tin, lead or tin-lead alloy thereupon.

31. A tin, lead or tin-lead alloy electroplating bath which comprises:
(a) a bath containing an alkanesulfonic acid and either a divalent tin salt, divalent lead salt thereof or both;
(b) at least one surfactant; and (c) benzal acetone, benzaldehyde, a benzaldehyde derivative or an aromatic pyridine compound.

32. The bath of claim 31 further comprising a bath soluble bismuth compound.

33. A method for electroplating a tin, lead or tin-lead alloy upon a substrate which comprises immersing a substrate into the electroplating bath of claim 32 and electroplating a tin, lead or tin-lead alloy thereupon.

34. A method for electroplating a tin, lead or tin-lead alloy upon a substrate which comprises immersing a substrate into the electroplating bath of claim 31 and electroplating a tin, lead or tin-lead alloy thereupon.

35. The bath of claim 31 further comprising a reducing agent for maintaining the tin in the divalent state.

36. A method for electroplating a tin, lead or tin-lead alloy upon a substrate which comprises immersing a substrate into the electroplating bath of claim 35 and electroplating a tin, lead or tin-lead alloy thereupon.

* * * * *